United States Patent [19]
Smith et al.

[11] 4,425,550
[45] Jan. 10, 1984

[54] CHARGE PUMP AMPLIFIER

[75] Inventors: Michael D. Smith; James A. Miller, both of Austin, Tex.

[73] Assignee: Motorola, Inc., Schaumburg, Ill.

[21] Appl. No.: 334,280

[22] Filed: Dec. 24, 1981

[51] Int. Cl.³ .............................................. H03F 1/34
[52] U.S. Cl. .................................................. 330/107
[58] Field of Search ............... 330/107, 302, 109, 151, 330/278

[56] References Cited
U.S. PATENT DOCUMENTS
4,329,599 5/1982 Gregorian et al. ................. 330/107

OTHER PUBLICATIONS

F. Krummenacher, "Micropower Switched Capacitor Biquadratic Cell", Seventh European Solid State Circuits Conference, Freiburg, Germany, Sep. 22-24, 1981.

Primary Examiner—James B. Mullins
Assistant Examiner—Gene Wan
Attorney, Agent, or Firm—Anthony J. Sarli, Jr.

[57] ABSTRACT

A charge pump amplifier useful for providing precise gain in integrated circuits is described. The amplifier uses an operational amplifier with a capacitive feedback to accumulate successive charges applied to the input of the operational amplifier by a switched-capacitor input. If the capacitors are of equal size, the gain of the amplifier is a function of the ratio of the frequency of the switched capacitor input and the frequency of discharge of the feedback capacitor.

5 Claims, 4 Drawing Figures

— PRIOR ART —

CHARGE PUMP AMPLIFIER

TECHNICAL FIELD

This invention relates to charge pump amplifiers usable in integrated circuits, and more particularly to a charge pump amplifier which provides a precise control of gain as a function of the ratio of switching frequencies of capacitive elements.

BACKGROUND ART

Many functions, particularly functions such as telecommunications functions requiring filters, audio amplifiers, and the like need precise gain stages. These functions typically may be combination digital and analog circuits on a single monolithic semiconductor substrate.

A conventional operational amplifier with a resistive feedback element and a resistive input element provides gain as a function of the ratio of the feedback resistor to the input resistor. In the design of integrated circuits, however, resistors have relatively poor processing tolerances. The poor tolerances of the resistors result in inaccuracies in the gain of such amplifier stages. To overcome the poor tolerance of integrated circuit resistors, circuits which require extreme precision have relied upon external components, the use of which is otherwise undesirable because of the requirement for additional pins on the integrated circuit package and the necessary additional space on the printed circuit board or other mounting means which contains the circuit of the particular function.

It is an object of the instant invention to provide an improved amplifier with an accurate gain which does not require the use of resistive elements to establish the gain of the amplifier.

BRIEF SUMMARY OF THE INVENTION

The object noted above is accomplished by the use of a circuit which switches an input voltage onto an input capacitor several times during each system cycle. The input capacitor in turn pumps the accumulated charge on to a second capacitor which forms a feedback network for an operational amplifier. At the end of the desired cycle, the output voltage from the feedback capacitor is sensed and the feedback capacitor is discharged. By carefully controlling the switching frequencies of the two capacitors, a precise gain is established, particularly where a stable oscillator is present to provide a reference frequency, and a frequency divider network is used to provide a precise relationship between the switching frequency of the input capacitor and the switching frequency of the feedback capacitor.

DETAILED DESCRIPTION OF A PREFERRED EMBODIMENT

Figure 1:
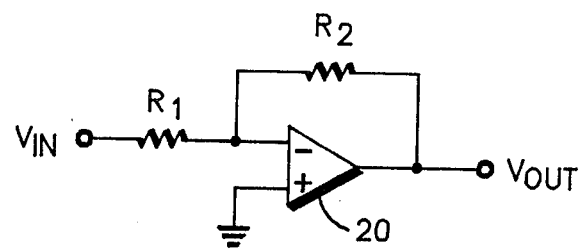
FIG. 1 shows an operational amplifier with a resistive feedback path as is well known in the prior art.

FIG. 1 shows a conventional operational amplifier 20 as is known in the prior art, wherein the amplifier 20 has a feedback resistance $R_2$, an input resistance $R_1$ which is connected to an input voltage source, and the output is taken off the output of the operational amplifier.

As is well known, the gain of such a circuit may be represented by the formula $V_{out}/V_{in} = -R_2/R_1$ or $V_{out} = -R_2 \times V_{in}/R_1$. Thus, the gain of such a circuit is a function of the ratio of the two resistive elements therein.

As previously noted, resistors have a poor tolerance factor in integrated circuit design since variations in resistance are introduced by process variations. The circuit of FIG. 2 overcomes the disadvantages associated with the integration of resistors or the requirement of providing off chip resistors to obtain a precise gain.

Figure 2:
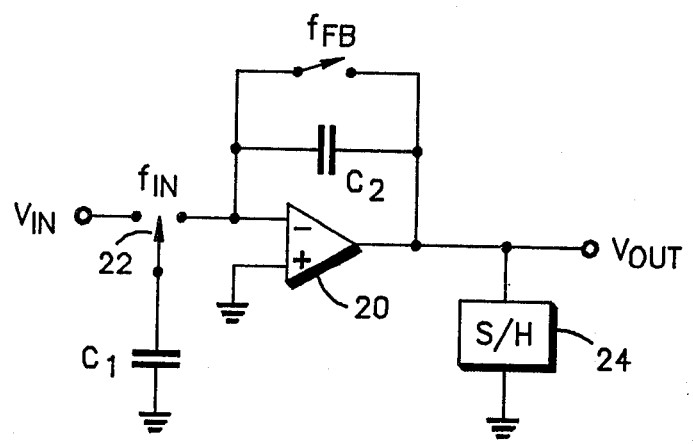
FIG. 2 is a circuit using an operational amplifier and having switched capacitor input in a capacitive feedback loop.

In FIG. 2, an operational amplifier 20 is connected with its negative input connected to a pole of switch 22. Another pole of the switch 22 is connected to the source of input voltage. A capacitor $C_1$ is alternately switched between the two switch poles at a frequency $f_{in}$.

The operational amplifier 20 has a feedback network in which capacitor $C_2$ is coupled between the output and the input of the operational amplifier. Across capacitor $C_2$ and in parallel therewith is a second switch which will act to selectively discharge the capacitor $C_2$. This switch is operated at a frequency $f_{fb}$. The output of the operational amplifier is connected to a sample and hold circuit 24 and the circuit output is taken from the sample and hold circuit. The sample and hold circuit 24 may be of conventional design.

The circuit of FIG. 2 simulates an amplifier with $V_{out}/V_{in} = -C_1/C_2$ for $f_{fb}$ equal to $f_{in}$. Therefore, the gain is dependent upon the ratio of sizes of the capacitors. However, if $C_1 = C_2$ and the two switches are operated at different frequencies, the amplifier gain becomes dependent on the ratio of switching frequencies. Note that the input, when switched faster than the feedback switch, simply pumps up capacitor $C_2$ until the feedback switch is closed, shorting the charge on capacitor $C_2$. Thus, for $C_1 = C_2$; $V_{out}/V_{in} = -f_{in}/f_{fb}$, for $f_{in}$ larger than $f_{fb}$.

It can be seen that integer values of gain are easily provided by this circuit merely by using a crystal oscillator (or other stable oscillator) and a frequency divider network. The clock for the input must be two-phase and non-overlapping, as will be made clear from the description of an MOS embodiment of the circuit, however, two-phase, non-overlapping clocks are relatively easily accomplished by utilizing a squaring circuit and slewing inverters as is known in the art.

Note that if the feedback capacitors discharge several times while the input is switched ($f_{fb}$ is greater than $f_{in}$) only a single pulse of magnitude $-V_{in}C_1/C_2$ occurs. Therefore, the circuit can provide gain but not attenuation.

Figure 3:
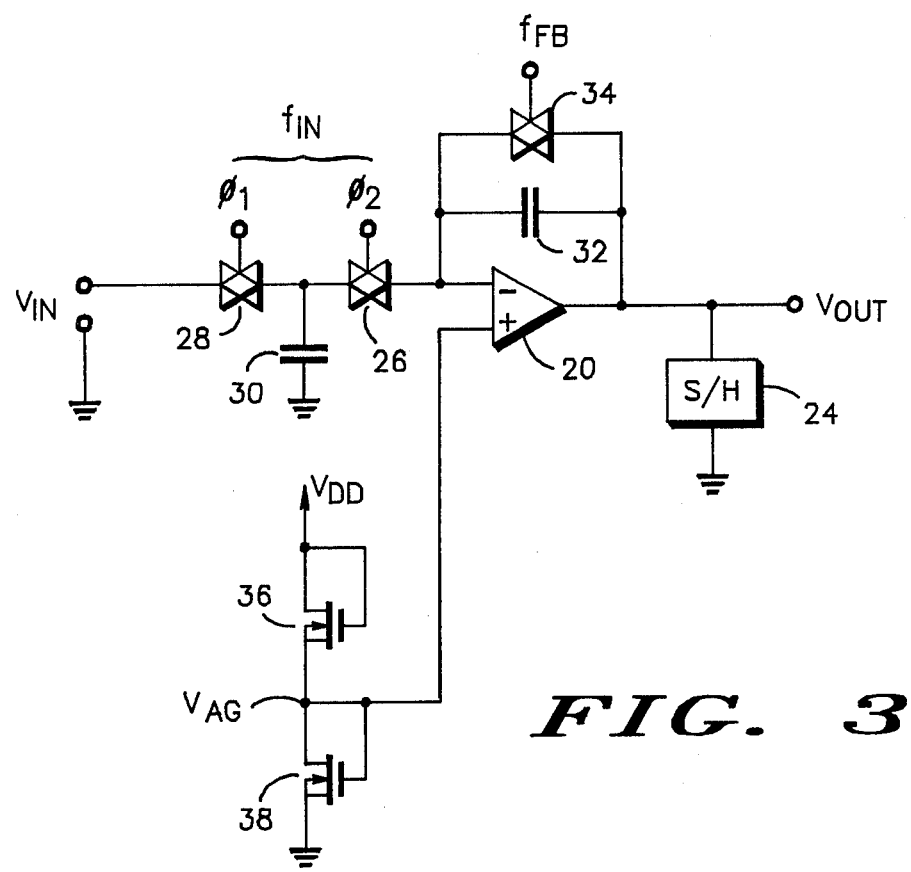
FIG. 3 is a schematic diagram of an implementation of the circuit of FIG. 2 in complementary MOS technology.

FIG. 3 shows a typical CMOS implementation of the circuit of the invention. An operational amplifier 20 is provided which has a negative input connected to a switch 26. The switch 26 may be implemented as a conventional CMOS transmission gate, rendered conductive by the application of a clock, in this case $\phi_2$. The other end of the transmission gate 26 is connected to a second transmission gate 28, the other side of which is connected to the input voltage source. Between the two switches is connected an input capacitor 30 one side of which is coupled to the node formed by the output of switch 28 and the input of switch 26 and the other side of which is connected to ground.

The operational amplifier 20 has a feedback capacitor 32 connected between the negative input and the output thereof. In parallel with capacitor 32 is another CMOS transmission gate 34 which is controllable at a frequency $f_{fb}$ to be rendered conductive or non-conductive.

The output of the operational amplifier is connected to sample and hold circuit 24, the output voltage being taken across the sample and hold circuit.

In telecommunications circuits, it is common to provide an analog ground reference voltage, which is typically midway between $V_{DD}$ and $V_{SS}$. $V_{SS}$ in this case, may be zero. The generation of such an analog ground is shown in FIG. 3 by a pair of N-channel transistors 36 and 38, connected with the drain of transistor 36 connected to $V_{DD}$ and the gate tied thereto, the source of transistor 36 being coupled to the drain of transistor 38, and the gate of transistor 38 coupled to that node. The source of transistor 38 is connected to ground. The node between the drain of transistor 36 and the source of transistor 38 provides an analog ground reference potential $V_{AG}$ which, in this case, is equal to approximately $V_{DD}/2$. The utilization of an analog ground in a circuit such as this allows the generation of a $V_{out}/V_{in}$ curve which is a positively-sloped function of the ratio of the input frequency to the feedback frequency. If a negatively-sloped curve is desired, the positive input terminal of the operational amplifier may be connected directly to ground as it was in FIG. 2.

In operation, an input voltage applied to the terminal $V_{in}$ is clocked on phase one of the input frequency clock to the capacitor 30, while, transmission gate 26 is non-conductive because of the absence of phase 2 of the $f_{in}$ clock. Phase one of the clock terminates and phase two subsequently renders transmission gate 26 conductive pumping the charge acquired on capacitor 30 to capacitor 32. When phase 2 becomes non-conductive and phase one again renders transmission gate 28 conductive, an additional charge is placed on capacitor 30 which is subsequently also pumped onto capacitor 32 on phase two of the $f_{in}$ clock. After a desired number of pumping cycles have taken place, the transmission gate 34 is closed thus transferring the charge on capacitor 32 to the sample and hold circuit 24, where it is sensed as $V_{out}$. The ratio of the frequencies, in the case where capacitors 30 and 32 are of equal or unit size, determines the precise gain of the amplifier stage. An advantage of having capacitors 30 and 32 as unit capacitors is that minimum integrated circuit layout area is consumed. Thus, to provide a gain, if the capacitors are both unit sized the switching frequencies can be ratioed to provide the gain. As previously noted, very precise integer gain can be determined by operating $f_{in}$ at a fixed stable frequency and generating $f_{fb}$ directly from a frequency divider also operated off $f_{in}$. As previously noted, transistors 36 and 38 merely form a voltage divider circuit to generate $V_{AG}$ to provide a positively-sloped $V_{out}/V_{in}$ curve.

Figure 4:
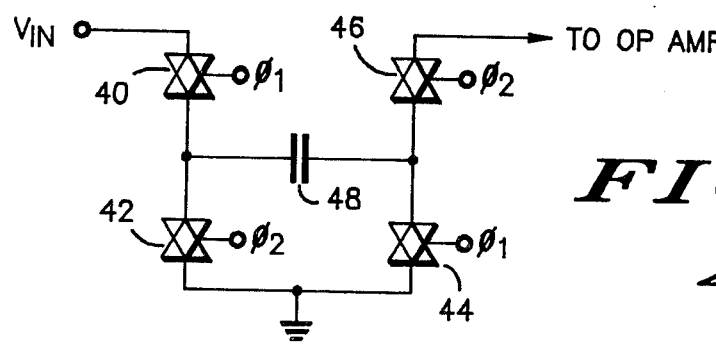
FIG. 4 shows a simple circuit for converting the gain of the amplifier from a negative slope to a positive slope curve.

In some applications, a source of $V_{AG}$ may not be conveniently present. In such a case, a positive slope can be generated by utilizing the circuit configuration of FIG. 4 applied to the negative input of the operational amplifier 20. A first transmission gate 40 is operated at an input frequency and from the phase one clock. A second transmission gate 42 is operated off the phase 2 clock. Transmission gate 42 is connected to an input of a transmission gate 44, and a node between the two transmission gates is coupled to ground. The output of the transmission gate 44 is provided to the input of a transmission gate 46 which is operated off clock phase two. The output of transmission gate 46 is applied to the input of the operational amplifier. An input capacitor 48 is coupled between the nodes between transmission gates 40 and 42 and between transmission gates 44 and 46. In operation, an input voltage appearing at $V_{in}$ is applied to transmission gate 40 which is rendered conductive on phase one. Transmission gate 42, at this time, is rendered non-conductive. Transmission gate 44 is also conductive since it is operated off phase one and transmission gate 46 is non-conductive. This applies an input voltage-related charge on capacitor 48 at a level from $V_{in}$ to ground. On phase two, transmission gate 42 becomes conductive and transmission gate 46 also becomes conductive thus transferring the charge in an inverted fashion to the input of the operational amplifier. Since the polarity of the charge on the capacitor 48 has now been inverted by the sequence of the operation of the transmission gates 40, 42, 44, 46, the output of the operational amplifier will be a negative slope of an inverted input function and therefore provide a positively-sloped function.

While the invention has been described in terms of a preferred embodiment thereof, modifications of the invention will become apparent to those skilled in the art. The invention is not intended to limited to the specific embodiment presented herein, but only by the claims appended hereto.

We claim:
1. A charge pump amplifier comprising:
   an operational amplifier having an input and an output;
   feedback means connected between the input and the output of the operational amplifier and comprising a storage means;
   means selectively coupled to the input of the operational amplifier and to a voltage source, for storing a charge from the voltage source, and for transferring the stored charge to the input of the operational amplifier;
   means for selectively discharging the storage means at a rate different than the rate at which the stored charges are applied to input of the operational amplifier;
   whereby a plurality of charges from the means for storing a charge are transferred to the storage means, and the plurality of the charges are accumulated by the storage means prior to the discharge thereof.

2. A charge pump amplifier as set forth in claim 1 wherein the means for storing a charge and for transferring the stored charge comprises a capacitor coupled to a switch.

3. A charge pump amplifier as set forth in claims 1 or 2 wherein the feedback means comprises a feedback capacitor.

4. A charge pump amplifier as set forth in claim 3 further comprising a switch, the switch being coupled in parallel to the feedback capacitor, and selectively operable to discharge the feedback capacitor.

5. A charge pump amplifier as set forth in claim 4 wherein the capacitor and the feedback capacitor are of equal size, whereby the voltage at the output of the operational amplifier is a function of the voltage at the voltage source and the number of charges transferred to the feedback capacitor before the feedback capacitor is selectively discharged.

* * * * *